(12) United States Patent
Ghia et al.

(10) Patent No.: US 10,930,116 B2
(45) Date of Patent: Feb. 23, 2021

(54) MULTI-BIN LOTTERY TICKET DISPENSER WITH FLOATING CIRCUIT BOARD CONFIGURATION

(71) Applicant: Scientific Games International, Inc., Newark, DE (US)

(72) Inventors: Ajay J. Ghia, Cumming, GA (US); Sten Hallundbaek Mejenborg, Cumming, GA (US); Mark Andrew Thompson, Buford, GA (US)

(73) Assignee: Scientific Games International, Inc., Newark, DE (US)

( * ) Notice: Subject to any disclaimer, the term of this patent is extended or adjusted under 35 U.S.C. 154(b) by 0 days.

(21) Appl. No.: 16/572,693

(22) Filed: Sep. 17, 2019

(65) Prior Publication Data

US 2020/0098225 A1 Mar. 26, 2020

Related U.S. Application Data

(60) Provisional application No. 62/733,794, filed on Sep. 20, 2018.

(51) Int. Cl.
*G07F 17/32* (2006.01)
(52) U.S. Cl.
CPC ............................... *G07F 17/3251* (2013.01)
(58) Field of Classification Search
None
See application file for complete search history.

(56) References Cited

U.S. PATENT DOCUMENTS

| 6,575,090 | B1 | 6/2003 | Vienneau et al. |
| 9,685,026 | B1* | 6/2017 | Garrison ............... G07F 17/329 |
| 2005/0211721 | A1* | 9/2005 | Chirnomas .......... B65G 47/912 |
| | | | 221/123 |
| 2006/0003605 | A1 | 1/2006 | Brooks et al. |
| 2014/0043162 | A1 | 2/2014 | Siciliano et al. |
| 2014/0046481 | A1 | 2/2014 | Siciliano et al. |
| 2015/0196445 | A1* | 7/2015 | Larkner .............. G07F 17/0092 |
| | | | 312/209 |
| 2017/0018148 | A1 | 1/2017 | Behm et al. |

FOREIGN PATENT DOCUMENTS

EP 2 202 752 A2 6/2010

OTHER PUBLICATIONS

EPO Search Report, dated Feb. 18, 2020.

* cited by examiner

*Primary Examiner* — Seng H Lim
(74) *Attorney, Agent, or Firm* — Dority & Manning, P.A.

(57) ABSTRACT

A lottery ticket dispenser array includes a plurality of separate bins, each bin having a housing with a back side. A circuit board fixed to the back side of the housing to supply power and control functions to the bin. The circuit boards of adjacent bins are rigidly interconnected via complimentary electronic connectors. At each bin, the circuit board is mounted to the back side of the housing with a defined relative degree of movement between the circuit board and the housing in at least a first direction. The rigidly interconnected circuit boards define a rigid structure and one or more of the bins are movable relative to the rigid structure such that the array absorbs misalignment, movement, and size variations between the bins without disconnection of the electronic connectors between the bins.

18 Claims, 4 Drawing Sheets

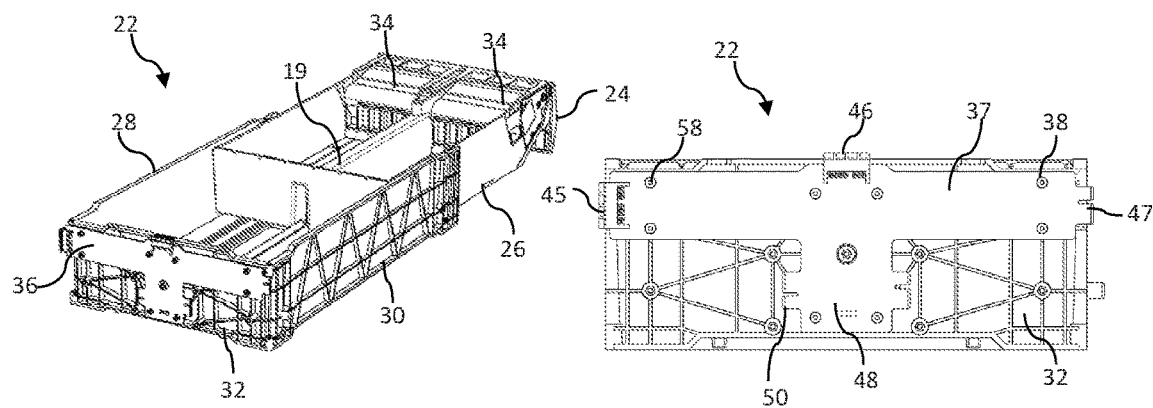
FIG. 4    FIG. 5
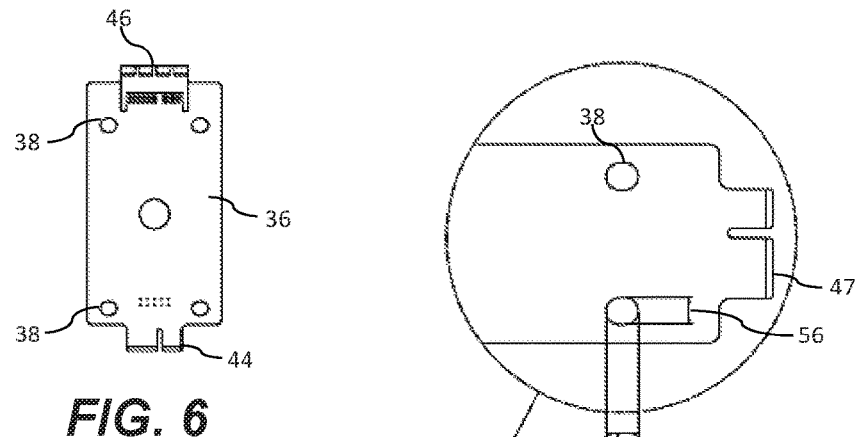
FIG. 6
FIG. 7b
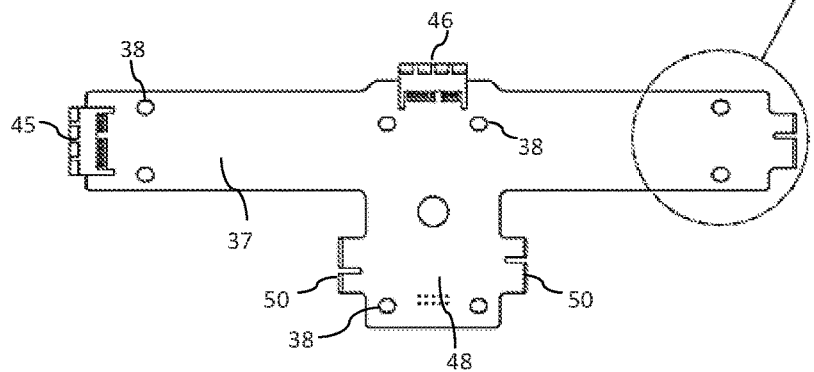
FIG. 7a

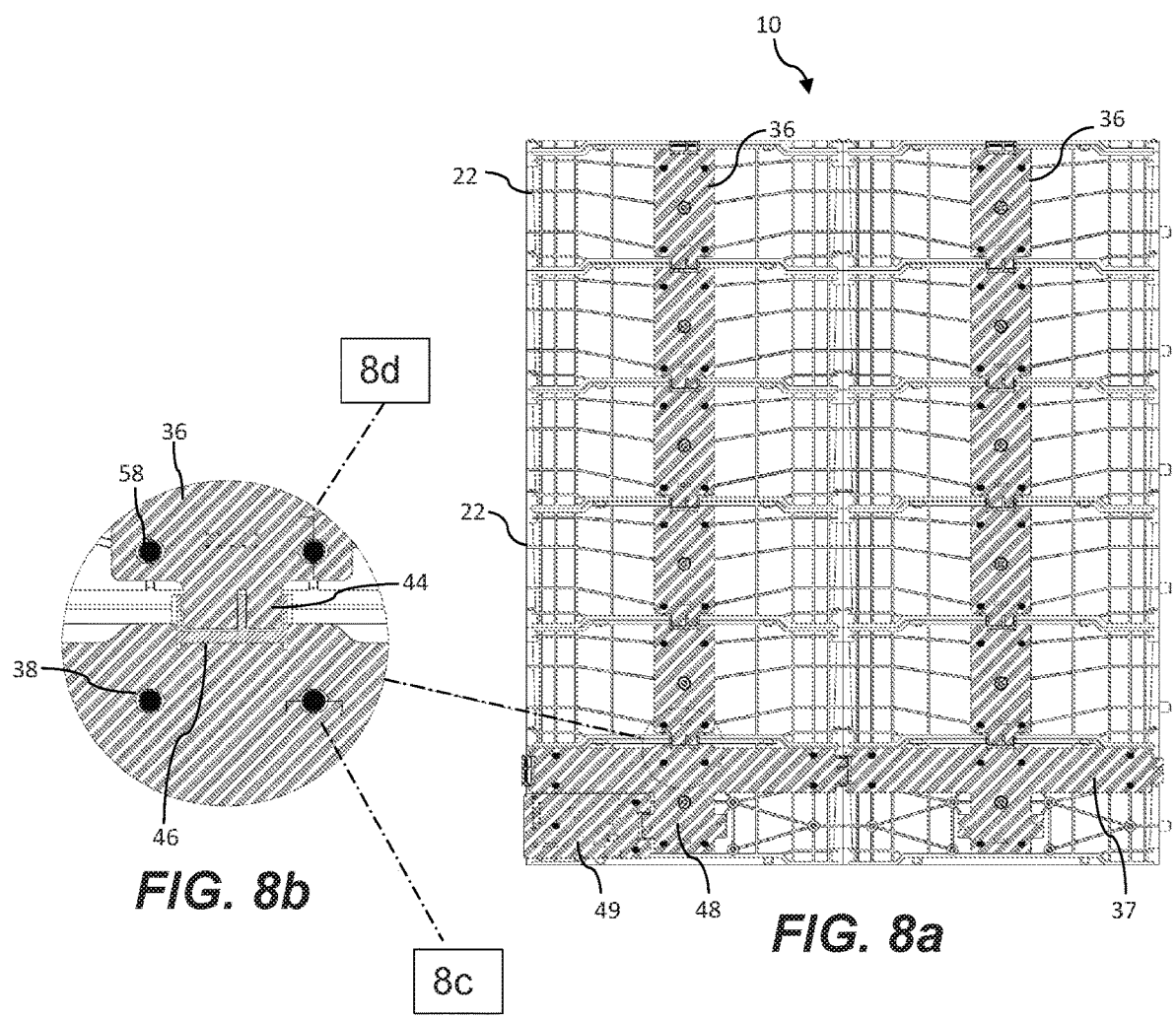

MULTI-BIN LOTTERY TICKET DISPENSER WITH FLOATING CIRCUIT BOARD CONFIGURATION

PRIORITY

The present application claims the benefit of Provisional Application No. 62/733,794 filed Sep. 20, 2018.

BACKGROUND

Instant lottery tickets (e.g., "scratch-off" lottery tickets) are sold at many types of retail locations including, stores, such as grocery stores, general merchandise stores, and the like. Various configurations of lottery ticket dispensers have been proposed in the industry for this purpose, including electronic dispensers that automatically dispense a ticket from a bin or compartment upon receipt of an electronic command signal.

For example, U.S. Pat. Publication No. 2017/0018148 describes a lottery ticket dispenser array that is configured in communication with a lottery ticket terminal and includes a plurality of separate dispensing bins having a different respective lottery ticket stored therein. For example, the dispenser array may include ten separate bins, with each bin containing a supply of different scratch-off lottery ticket games. Each lottery ticket contained in the bins includes a machine readable code printed thereon, such as a bar code, QR code, or the like. Each bin in the array includes an electronic drive mechanism that, when activated, dispenses one or more lottery tickets from the bin (depending on the number of tickets requested by the patron). Each bin also includes a scanner disposed to read the code on lottery tickets dispensed from the bin position. In operation of the system, the lottery ticket terminal transmits a purchase signal for dispensing a particular lottery ticket that is routed to the respective bin containing the lottery ticket, which activates the drive mechanism to dispense the requisite number of tickets. As the tickets are dispensed from the bin, the scanner may read the code printed on each ticket, which eventually results in a signal being routed to a central lottery server for each lottery ticket dispensed from the dispenser array. The code printed on each ticket contains identifying information unique to the ticket, and the signal transmitted to the central server enables actions relevant to the sale of the tickets, such as activating the ticket in the lottery provider's system, accounting for tickets sold at a particular retail establishment, reconciling tickets sold at a retail establishment with tickets delivered to the establishment, and for forth.

In the '148 publication, the individual interconnected bins within the array are in direct communication with a central lottery server. The array includes a bottom row of bins with interconnected base structures, wherein each base structure include a male power plug and male data plug along one side, and a female power port and female data port along the opposite side. The plugs and ports of adjacent base structures interconnect to essentially define a data bus running the length of the base structures. An exposed power port and data port at one of the ends of the interconnected base structures is available for connection with a power cord and a data cord from the controller or lottery terminal. Each bin includes a male power/data connector on the top or bottom surface, and a corresponding female power/data connector on the opposite surface. With this configuration, a plurality of the bins can be vertically stacked and interconnected, wherein the bottommost bin in each stack is connected to or contains one of the base structures such that the bins in each stack are connected in series to the data bus and, thus, to the controller.

A potential issue, however, with the interconnected bins is the reliability and integrity of the power/data connection between the individual bins. Due to manufacturing tolerances of the bin components, number of bins within the array, relative movement between the bins within each stack, relative movement between stacks within the array, and so forth, the connectors between the individual bins are placed under a relatively great amount of stress and movement. This situation is particularly acute for the bins closer to the top of the array. If the power/data connection fails, the bin, and sometimes the entire array, becomes inoperable.

The present invention provides an improved electronic power/data connector configuration for the lottery ticket dispenser array that corrects the potential deficiency noted above.

SUMMARY

Objects and advantages of the invention will be set forth in part in the following description, or may be obvious from the description, or may be learned through practice of the invention.

In accordance with aspects of the invention, a lottery ticket dispenser array is provided. The array includes a plurality of separate ticket bins, with each bin having a back side. Each bin includes a circuit board fixed to the back side of the housing, wherein the circuit board supplies power and control functions to the bin. For example, each bin may include a drive mechanism that dispenses an individual lottery ticket from the bin upon receipt of a dispense signal via the circuit board, wherein power to the drive mechanism is also provided via the circuit board. Each bin may also include a scanner that reads a code on the lottery ticket as the ticket is dispensed, wherein power to the scanner is provided via the circuit board and the scanned code is transmitted from the scanner via the circuit board to a downstream controller in communication with the dispenser array. It should be appreciated that the array is not limited by the power or control functions that are provided by the circuit boards.

Within the array, the circuit boards of adjacent bins (in at least one direction) are rigidly interconnected via complimentary electronic connectors.

At each bin, the circuit board is mounted to the back side of the housing with a defined relative degree of movement between the circuit board and the back side of the housing in at least a first direction, which may be in the horizontal direction. Thus, the rigidly interconnected circuit boards define a rigid structure and one or more of the bins are movable relative to the rigid structure such that the array is capable of operationally withstanding ("absorbing") at least some degree of misalignment, movement, and size variations between the bins without disconnection of the electronic connectors between the bins.

In a particular embodiment, the bins are arranged in a plurality of adjacent vertical stacks, wherein the circuit boards of adjacent bins within each stack are interconnected via the complimentary electronic connectors. With this embodiment, the circuit board of a bottommost or topmost bin of each of the stacks may include complimentary side electronic connectors, wherein the bottommost or topmost bins are electronically interconnected across (horizontal) the array and essentially define a data/power bus running along the bottom or top of the array with each of the stacks connected to this bus.

The circuit boards may be fixed to the back side of the bin housings in a variety of ways to provide the desired "float" (relative degree of movement). In a particular embodiment, each of the circuit boards has one or more slotted holes defined therein, and the back side of the housing includes posts that extend through the slotted holes. A circumferential clearance or "surrounding gap" between the posts and the slotted holes provides the relative degree of movement in the first direction, e.g., the horizontal direction, between the circuit board and the back side of the housing. This circumferential clearance may include a clearance in a second direction, e.g., the vertical direction, as well such that a relative degree of movement in the vertical direction is provided between the circuit board and the back side of the housing. In a certain embodiment, the relative degree of movement in the vertical direction is less than in the horizontal direction. The sizes of the slots in the circuit board are sized so as to compensate for potentially larger variations in the size of the housings (due to machine tolerances) as compared to potential size differences of the circuit boards.

With the above configuration, the posts may have a height that is greater than a thickness of the circuit boards, wherein a fastener, such as a rivet or a screw, extends through the post with a head that engages a top of the post to secure the circuit board to the back side of the housing.

It should be appreciated that various types of conventional power/data connectors may be configured on the circuit boards, including conventional multi-pin connectors. The complimentary electronic connectors may include a male connector (e.g., a male multi-pin connector) at one end of the circuit board and a complimentary female connector (e.g., a female multi-pin connector) at an opposite end of the circuit board.

The size, shape, and configuration of the individual bins can vary widely within the scope and spirit of the invention. In a particular embodiment, each bin includes a drawer that slides into and out of the housing, wherein the drawer defines an internal space for receipt of a supply of interconnected lottery tickets, such as a fan-folded stack or a roll of interconnected tickets. In one embodiment, the housing and the drawer may have an open top such that, within the array, a bottom surface of a first bin defines a top of an adjacent lower bin.

The present invention also encompasses individual lottery ticket bins as described above for use in a multi-bin dispenser array. Such a bin may include housing having a back side and a circuit board fixed to the back side, wherein the circuit board supplies power and control functions to the bin. The circuit board includes a first electronic connector at a first side thereof and a second complimentary electronic connector at an opposite side there. The circuit board is mounted to the back side of the housing with a defined relative degree of movement or "float" between the circuit board and the back side of the housing in at least a first direction. With this configuration, when the lottery ticket bin is arranged within a dispenser array, the circuit boards of adjacent bins are interconnectable and one or more of the ticket bins are movable relative to the interconnected circuit boards.

In a particular embodiment of the individual bin, the circuit board includes slotted holes defined therein and the back side of the housing includes posts that extend through the slotted holes. A circumferential clearance between the posts and the slotted holes provides the relative degree of movement in at least the first direction (e.g., a horizontal direction) between the circuit board and the back side of the housing. The circumferential clearance may include a different (e.g., vertical) component such that a relative degree of movement in the vertical direction is provided between the circuit board and the back side of the housing. The relative degree of movement in the vertical direction may be less than in the horizontal direction.

The posts may have a height greater than a thickness of the circuit board, wherein a fastener extends through the post and includes a head that engages against a top of the post to secure the circuit board to housing.

The bin may be variously configured and, in one embodiment, may include a drawer that slides into and out of the housing, the drawer defining an internal space for receipt of a supply of interconnected lottery tickets. The housing and the drawer may have an open top such that, within the array, a bottom surface of a first bin defines a top of an adjacent lower bin.

Aspects of the lottery ticket dispenser array and individual ticket bins will be described in greater detail below.

BRIEF DESCRIPTION OF THE DRAWINGS

A full and enabling disclosure including the best mode of practicing the appended claims and directed to one of ordinary skill in the art is set forth more particularly in the remainder of the specification. The specification makes reference to the appended figures, in which:

FIG. 4 is a back perspective view of an individual ticket bin from the lottery ticket dispenser array of FIG. 2;

FIG. 5 is a back view of the ticket bin of FIG. 4;

FIG. 6 is a front view of a circuit board used on upper ticket bins within the lottery ticket dispenser array of FIG. 2;

FIG. 7a is a front view of a circuit board used on the bottom ticket bins within the lottery ticket dispenser array of FIG. 2;

FIG. 7b is an enlarged view of a side of the circuit board of FIG. 7a;

FIG. 8a is a back view of an embodiment of the circuit board configuration of the lottery ticket dispenser array of FIG. 2;

FIG. 8b is an enlarged view of a portion of the circuit board configuration of FIG. 8a;

DETAILED DESCRIPTION

Reference will now be made in detail to various and alternative exemplary embodiments and to the accompanying drawings, with like numerals representing substantially identical structural elements. Each example is provided by way of explanation, and not as a limitation. In fact, it will be apparent to those skilled in the art that modifications and variations can be made without departing from the scope or spirit of the disclosure and claims. For instance, features illustrated or described as part of one embodiment may be used on another embodiment to yield a still further embodiment. Thus, it is intended that the present disclosure includes modifications and variations as come within the scope of the appended claims and their equivalents.

Figure 1:
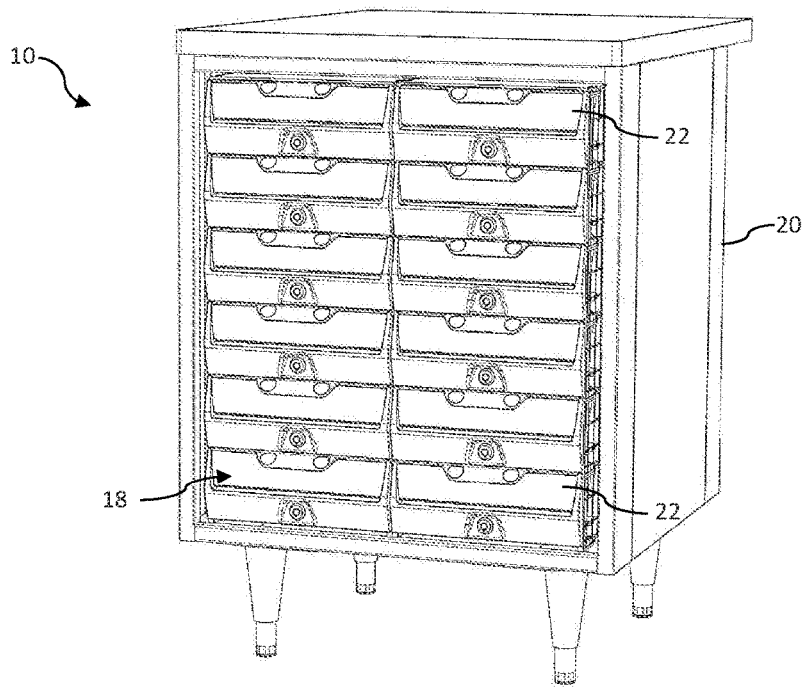
FIG. 1 is a perspective view of an embodiment of a lottery ticket dispenser array within a cabinet in accordance with aspects of the present invention.

FIG. 1 depicts an embodiment of a dispenser array 10 for dispensing lottery tickets (not shown) at a retail establishment, such as a convenience store, retail store, pub, restaurant, or the like, that is generally authorized by a lottery jurisdiction to carry out lottery activities, such as the sale of instant scratch-off tickets or terminal printed draw tickets for games such as Powerball™. The lottery jurisdiction may be a state lottery authority, such as the Pennsylvania Lottery, or any other governmental jurisdictional authority. A separate game provider may be partnered with the lottery jurisdiction to provide certain control, implementation, and logistical functions of the game. It should be appreciated that the type of retail establishment or lottery jurisdiction entities are not limiting factors of the invention.

Figure 2:
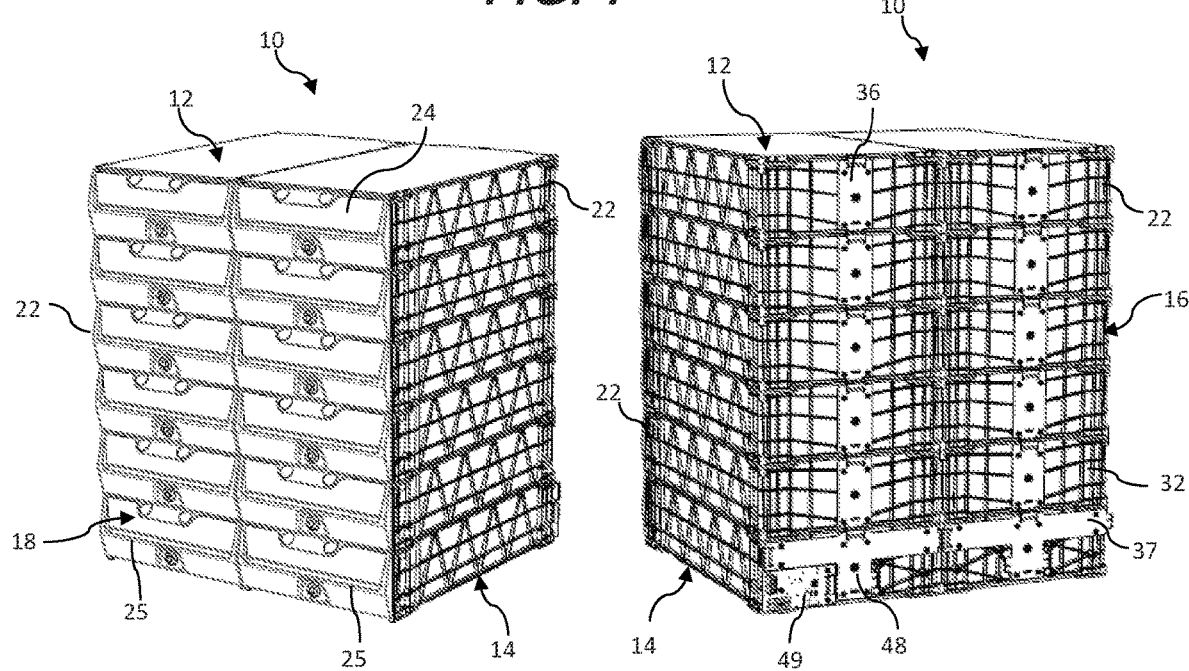
FIG. 2 is a front perspective view of the lottery ticket dispenser array removed from the cabinet.
Figure 3:
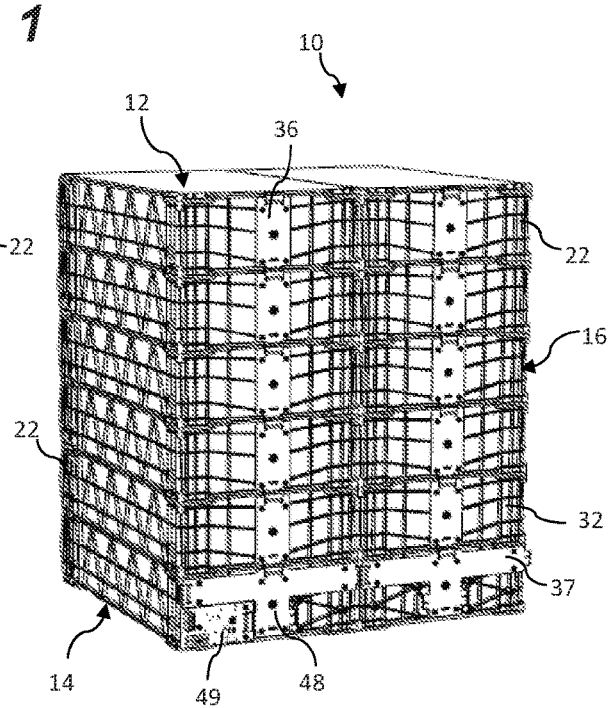
FIG. 3 is a back perspective view of an embodiment of a lottery ticket dispenser array.

Referring to FIGS. 1-3 in general, the array 10 includes a plurality of separate ticket bins 22 that, collectively, define a top 12, sides 14, back 16, and front 18 of the array 10. The bins 22 may be physically interconnected by any manner of suitable structure provided on the sides, top, or bottom of the bins 22. Each bin 22 has a front face 24 with a dispensing slot 25 through which lottery tickets contained in the bin 22 are dispensed. Each bin defines an internal space for receipt of at least one supply of lottery tickets, for example in the form of a fan-folded stack of interconnected tickets or a roll of interconnected tickets. In the depicted embodiment, each bin 22 is configured to house and dispense two separate supplies of lottery tickets and includes side-by-side compartments separated by an internal wall 19. Each compartment includes an operational component section 34 at the front thereof that may include a drive mechanism, scanner or other type of reader, cutting bar or mechanism, control circuitry, and so forth. It should be appreciated that each bin 22 may include any number of compartments and associated component sections 34.

In the depicted embodiment, the bins 22 have a relatively low height profile and are designed to contain a stack of fan-folded lottery tickets laid flat in the respective compartments. This configuration is particularly well-suited for an "under-the-counter" system wherein the array 10 is operationally located within a cabinet 20 (FIG. 1) that is sized to fit under a retail counter. This arrangement removes the array from on or above the retail counter and frees up valuable space at the point of sale (POS) counter at the retail establishment, which is highly desirable to retailers.

Each bin 22 has a housing structure 28 that includes sides 30 and a back side 32. The back sides 32 collectively define the back 16 of the dispenser array 10. A circuit board 36 is fixed to the back side 32 of the bin housing 28 and is configured to supply power and control functions to the bin. For example, as mentioned, each bin 22 (or compartment within the bin 22) may include a drive mechanism in the component section 34 that dispenses an individual lottery ticket from the bin through the dispense slot 25 upon receipt of a dispense signal via the circuit board 36, wherein power to the drive mechanism is also provided via the circuit board. Each bin 22 (or component section 34) may also include a scanner that reads a code on the lottery ticket as the ticket is dispensed, wherein power to the scanner is provided via the circuit board 36 and the scanned code is transmitted from the scanner via the circuit board 36 to a downstream controller or central lottery server/computer that is in communication with the dispenser array 10. It should be appreciated that the array 10 is not limited by the power or control functions that are provided by the circuit boards 36 or performed by the operational components within the component section 34.

Referring to FIG. 3, within the array 10, the circuit boards 36 of adjacent bins are rigidly interconnected via complimentary electronic connectors 44, 46 (described in greater detail below) so that all of the circuit boards 36 combine to form a generally rigid structure with minimal relative play or movement between the circuit boards 36. For example, in the depicted embodiment, the bins 22 are arranged in vertical adjacent stacks within the array 10, with the circuit boards 36 of adjacent bins within each stack interconnected such that the bins 22 are electronically connected in series within the stack. With this embodiment, the circuit board 37 of a bottommost bin 22 of each stack may include complimentary side electronic connectors 45, 47, wherein the bottommost bins 37 are electronically interconnected across (horizontal) the array 10 and essentially define a data/power bus running along the bottom of the array 10 with each of the stacks connected to this bus. Thus, all of the circuit boards 36, 37 within the array 10 are interconnected. Although not depicted in the figures, in an alternate embodiment, the circuit boards 37 may be configured with the topmost bins within the array, wherein the topmost bins 37 are electronically interconnected across (horizontal) the array 10 and essentially define a data/power bus running along the top of the array 10 with each of the stacks connected to this bus. Thus, all of the circuit boards 36, 37 within the array 10 are interconnected.

Referring to FIGS. 3 and 7a, the array 10 may also include a control/interface board 50 that is connected to the circuit boards 36, 37. For this, the circuit board 37 of one of the end bins 22 includes an additional interface connector 50 that connects with a complimentary connector on the interface board 50. The interface/control board 50 supplies power and places the array 10 in communication with a downstream terminal, such as a POS terminal, that issues dispense commands to particular bins 22. The board 50 may also place the array 10 in direct or indirect communication with a remote computer or server, such as a central lottery server, that manages the various control functions associated with the array 10.

With the particular embodiment depicted in the figures, at each bin 22, the circuit board 36, 37 is mounted to the back side 32 of the housing 28 with a defined relative degree of movement ("float") between the circuit board 36, 37 and the back side 32 of the housing in at least a first direction, such as the horizontal direction. Thus, although the interconnected circuit boards 36, 37 define a generally rigidly interconnected circuit board structure, the structure is movable to a degree relative to one or more of the bins 22. This unique feature provides the array 10 with the capability of withstanding movement between stacks of bins 22 or between individual bins 22 during normal operational conditions, or misalignment of bins due to manufacturing tolerances, without the circuit boards 36, 37 becoming disconnected.

To provide the relative movement, the circuit boards 36, 37 may be fixed to the back side 32 of the bin housings 28 in a variety of ways. In the illustrated embodiment (FIGS. 7a-8d), the circuit boards 36, 37 include one or more slotted holes 38 defined therein, with the slotted holes 38 having a horizontal dimension 54 and a vertical dimension 56. The housing 28 includes posts 58 on the back side 32 thereof on which the boards 36, 37 are mounted such that the posts 58 extend through the slotted holes 38. A size difference between the posts 58 and the slotted holes 38 results in a surrounding gap 60 (FIG. 8c) between the posts 58 and the slotted holes 38 in at least one direction, such as the horizontal direction, thereby providing the "float" between the circuit board and the back side of the housing in the horizontal direction. This surrounding gap 60 may include a clearance 62 (FIG. 8d) in the vertical direction as well such that a relative degree of movement in the vertical direction is also provided between the circuit board 36, 37 and the back side 32 of the housing 28. Because the circuit boards 36, 37 are interconnected in the vertical direction, to prevent the circuit boards 36, 37 from disconnecting or pulling-out, the relative degree of movement in the vertical direction is less than in the horizontal direction.

Figure 8C:
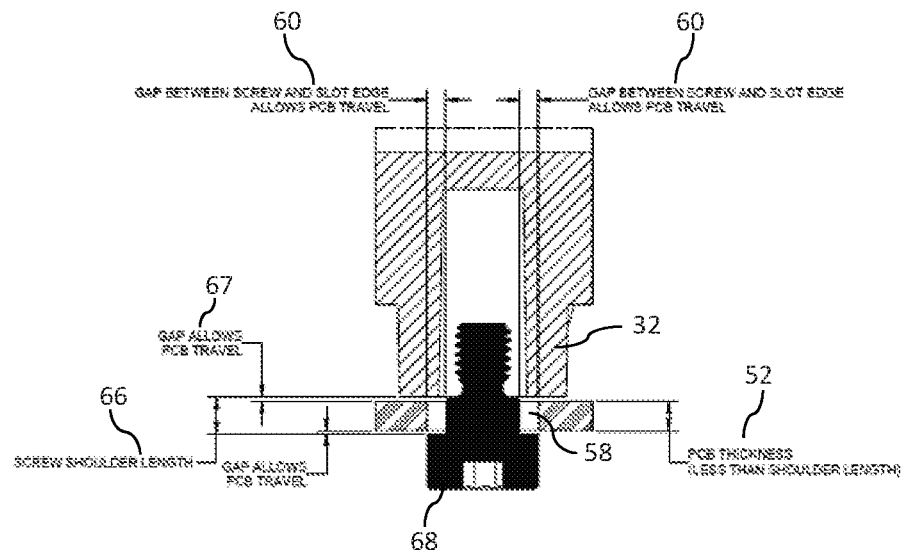
FIG. 8c is an enlarged view of a portion of FIG. 8b.
Figure 8D:
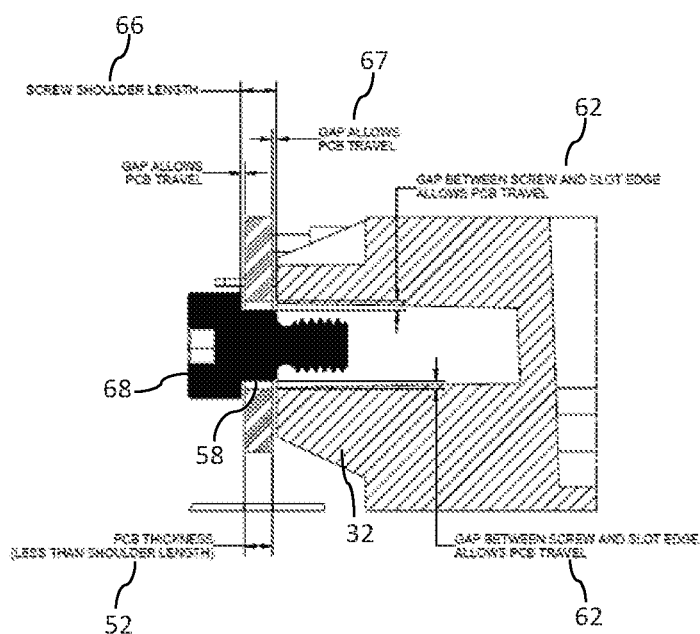
FIG. 8d is an enlarged view of a portion of FIG. 8b.

Referring to FIGS. 8c-8d, the posts 58 have a height 66 ("shoulder") that is greater than a thickness 52 of the circuit boards 36, 37. A fastener 68, such as a rivet or a screw, extends through the post 58 with a head that engages a top of the post to secure the circuit board 36, 37 to the back side 32 of the housing 28. This results in a gap 67 or clearance between the head of the fastener 68 and the housing 28, which allows the circuit board 36, 37 to move relative to the back side 32.

With respect to the various complimentary connectors 44, 46 and 45, 47 used to interconnect the circuit boards 36, 37, it should be appreciated that various types of conventional power/data connectors may be configured on the circuit boards 36, 37, including conventional multi-pin connectors. The complimentary electronic connectors may include a male connector 44, 47 (e.g., a male multi-pin connector) at one end of the circuit board 36, 37 and a complimentary female connector 46, 45 (e.g., a female multi-pin connector) at an opposite end of the circuit board 36, 37.

It should be appreciated that the size, shape, and configuration of the individual bins 22 can vary widely within the scope and spirit of the invention. In the particular embodiment depicted in the figures, each bin 22 includes a drawer 26 that slides into and out of the housing 28, wherein the drawer 28 includes its own sides and bottom and defines one or more internal spaces for receipt of one or more supplies of interconnected lottery tickets, such as a fan-folded stack or a roll of interconnected tickets. The housing 28 and the drawer 26 may have an open top (FIG. 4) such that, within the array 10, a bottom surface of an upper first bin 22 defines a top of an adjacent lower bin 22, as can be appreciated from FIGS. 3 and 8a.

The present invention also encompasses individual lottery ticket bins 22 as described above for use in a multi-bin dispenser array 10. Such a bin 22 may include housing 28 having a back side 32 and a circuit board 36, 37 fixed to the back side 32, wherein the circuit board 36m 37 supplies power and control functions to the bin 22. The circuit board 36m 37 includes a first electronic connector 44, 47 at a first side thereof and a second complimentary electronic connector 46, 45 at an opposite side there. The circuit board 36, 37 is mounted to the back side 32 of the housing with a defined relative degree of movement or "float" between the circuit board 36, 37 and the back side 32 of the housing 28 in at least a first (e.g., a horizontal) direction. With this configuration, when the lottery ticket bin 22 is arranged within a dispenser array 10, the circuit boards 36, 37 of adjacent bins 22 are interconnectable and one or more of the ticket bins 22 are movable relative to the interconnected circuit boards 36, 37, as discussed above.

The material particularly shown and described above is not meant to be limiting, but instead serves to show and teach various exemplary implementations of the present subject matter. As set forth in the attached claims, the scope of the present invention includes both combinations and sub-combinations of various features discussed herein, along with such variations and modifications as would occur to a person of skill in the art.

What is claimed is:

1. A lottery ticket dispenser array, comprising:
   a plurality of separate bins, each bin comprising a housing having a back side;
   each bin further comprising a circuit board fixed to the back side of the housing, the circuit board supplying power and control functions to the bin, the circuit boards of adjacent bins rigidly interconnected via complimentary electronic connectors;
   at each of the bins, the circuit board mounted to the back side of the housing with a defined relative degree of movement between the circuit board and the back side of the housing in at least a first direction; and
   wherein the rigidly interconnected circuit boards define a rigid structure and one or more of the bins are movable relative to the rigid structure such that the array absorbs misalignment and size variations of the bins without disconnection of the electronic connectors between the bins.

2. The lottery ticket dispenser array as in claim 1, wherein the bins are arranged in a plurality of adjacent stacks, the circuit boards of adjacent bins within each stack interconnected via the complimentary electronic connectors.

3. The lottery ticket dispenser array as in claim 2, wherein the circuit board of a bottommost or topmost bin of each of the stacks comprises complimentary side electronic connectors, and the bottommost or topmost bins are electronically interconnected.

4. The lottery ticket dispenser array as in claim 1, wherein the circuit boards comprise slotted holes defined therein, the back sides of the housing comprising posts that extend through the slotted holes, wherein a surrounding gap clearance between the posts and the slotted holes provides the relative degree of movement in the first direction between the circuit board and the back side of the housing.

5. The lottery ticket dispenser array as in claim 4, wherein the first direction is horizontal and the surrounding gap between the posts and the slotted holes comprises a clearance in a vertical direction such that a relative degree of movement in the vertical direction is provided between the circuit board and the back side of the housing.

6. The lottery ticket dispenser array as in claim 5, wherein the relative degree of movement in the vertical direction is less than in the horizontal direction.

7. The lottery ticket dispenser array as in claim 5, wherein the posts have a height greater than a thickness of the circuit boards, and further comprising a fastener that extends through the post to secure the circuit board to the back side of the housing thereby allowing the connected circuit board to move independently of the housing.

8. The lottery ticket dispenser array as in claim 1, wherein the complimentary electronic connectors comprise a male connector at one end of the circuit board and a complimentary female connector at an opposite end of the circuit board.

9. The lottery ticket dispenser array as in claim 1, wherein each bin further comprises a drawer that slides into and out of the housing, the drawer comprising an internal space for receipt of a supply of interconnected lottery tickets.

10. The lottery ticket dispenser array as in claim 9, wherein the housing and the drawer have an open top such that, within the array, a bottom surface of a first bin defines a top of an adjacent lower bin.

11. A lottery ticket bin for use in multi-bin dispenser array, comprising:

a housing having a back side;

a circuit board fixed to the back side, the circuit board supplying power and control functions to the bin;

the circuit board comprising a first electronic connector at a first side thereof and a second complimentary electronic connector at an opposite side there;

the circuit board mounted to the back side of the housing with a defined relative degree of movement between the circuit board and the back side of the housing in at least a first direction; and wherein when the lottery ticket bin is arranged within a dispenser array, the circuit boards of adjacent bins are interconnectable and one or more of the ticket bins are movable relative to the interconnected circuit boards.

12. The lottery ticket bin as in claim 11, wherein the circuit board comprises slotted holes defined therein, the back side of the housing comprising posts that extend through the slotted holes, wherein a circumferential clearance between the posts and the slotted holes provides the relative degree of movement in the horizontal direction between the circuit board and the back side of the housing.

13. The lottery ticket bin as in claim 12, wherein the first direction is horizontal and the circumferential clearance between the posts and the slotted holes further comprises a clearance in a vertical direction such that a relative degree of movement in the vertical direction is provided between the circuit board and the back side of the housing.

14. The lottery ticket bin as in claim 13, wherein the relative degree of movement in the vertical direction is less than in the horizontal direction.

15. The lottery ticket bin as in claim 13, wherein the posts have a height greater than a thickness of the circuit board, and further comprising a fastener that extends through the post to secure the circuit board to the back side of the housing.

16. The lottery ticket bin as in claim 11, wherein the first electronic connector comprises a male connector and the second complimentary connector comprises a female connector.

17. The lottery ticket bin as in claim 11, further comprising a drawer that slides into and out of the housing, the drawer comprising an internal space for receipt of a supply of interconnected lottery tickets.

18. The lottery ticket bin as in claim 17, wherein the housing and the drawer have an open top such that, within the array, a bottom surface of a first bin defines a top of an adjacent lower bin.

* * * * *